US010327350B2

(12) United States Patent
Aarskog

(10) Patent No.: US 10,327,350 B2
(45) Date of Patent: Jun. 18, 2019

(54) CONVERTER WITH SEPARATE CAPACITOR HOUSING

(71) Applicant: Siemens Aktiengesellschaft, Munich (DE)

(72) Inventor: Fredrik Gundersen Aarskog, Raelingen (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/577,805

(22) PCT Filed: May 20, 2016

(86) PCT No.: PCT/EP2016/061419
§ 371 (c)(1),
(2) Date: Nov. 29, 2017

(87) PCT Pub. No.: WO2016/198253
PCT Pub. Date: Dec. 15, 2016

(65) Prior Publication Data
US 2018/0168062 A1    Jun. 14, 2018

(30) Foreign Application Priority Data

Jun. 12, 2015 (EP) .................................. 15171872

(51) Int. Cl.
*H01G 4/224* (2006.01)
*H01G 2/10* (2006.01)
(Continued)

(52) U.S. Cl.
CPC ............ *H05K 7/1432* (2013.01); *H01G 2/10* (2013.01); *H02M 1/32* (2013.01); *H05K 5/067* (2013.01);
(Continued)

(58) Field of Classification Search
CPC ...... H05K 7/1432; H05K 5/067; H05K 5/069; H02M 1/32; H01G 4/224; H01G 4/38; H01G 2/10
See application file for complete search history.

(56) References Cited

U.S. PATENT DOCUMENTS 2,383,480 A * 8/1945 Heyman ................. H01G 4/258
361/274.1
2,562,972 A * 8/1951 Wald ....................... H01B 3/20
141/11
(Continued)

FOREIGN PATENT DOCUMENTS

CH    134768 A    8/1929
EP    0994494 A1    4/2000
(Continued)

OTHER PUBLICATIONS

PCT International Search Report and Written Opinion of International Searching Authority dated Sep. 13, 2016 corresponding to PCT International Application No. PCT/EP2016/061419 filed May 20, 2016.
(Continued)

*Primary Examiner* — Dion Ferguson
(74) *Attorney, Agent, or Firm* — Harness, Dickey & Pierce, P.L.C.

(57) ABSTRACT

A subsea converter includes an outer housing, configured to be in contact with the subsea water when the converter is installed subsea, and an inner housing provided inside the outer housing. The inner housing is fluid tight sealed against the outer housing. Further, at least one first electric component is located inside the outer housing but outside the inner housing. The outer housing is filled with a first dielectric fluid and at least one capacitor is located inside the inner housing. Finally, the inner housing is filled with a second
(Continued)

dielectric fluid, the second dielectric fluid having a lower moisture content than the first dielectric fluid.

16 Claims, 5 Drawing Sheets

(51) Int. Cl.
    *H05K 7/14*     (2006.01)
    *H02M 1/32*     (2007.01)
    *H05K 5/06*     (2006.01)
    *H01G 4/38*     (2006.01)

(52) U.S. Cl.
    CPC ............. *H05K 5/068* (2013.01); *H05K 5/069* (2013.01); *H01G 4/224* (2013.01); *H01G 4/38* (2013.01)

(56) References Cited

U.S. PATENT DOCUMENTS

| | | |
|---|---|---|
| 6,262,876 B1 | 7/2001 | Schimanek |
| 6,563,692 B2 | 5/2003 | Feiler |
| 10,049,818 B2 * | 8/2018 | Aarskog ............. E21B 41/0007 |
| 2015/0170839 A1 * | 6/2015 | Aarskog ................... H01G 2/10 361/273 |
| 2016/0247631 A1 * | 8/2016 | Aarskog ................... H01G 2/10 |
| 2017/0140872 A1 * | 5/2017 | Aarskog ............. E21B 41/0007 |

FOREIGN PATENT DOCUMENTS

| | | |
|---|---|---|
| EP | 1256965 A2 | 11/2002 |
| EP | 1998344 A1 | 12/2008 |
| EP | 2782434 A1 | 9/2014 |
| EP | 2983184 | 2/2016 |
| JP | 2001284193 A | 10/2001 |
| WO | WO 2008055515 A1 | 5/2008 |

OTHER PUBLICATIONS

Extended European Search Report dated Mar. 12, 2015.

* cited by examiner

CONVERTER WITH SEPARATE CAPACITOR HOUSING

PRIORITY STATEMENT

This application is the national phase under 35 U.S.C. § 371 of PCT International Application No. PCT/EP2016/061419 which has an International filing date of May 20, 2016, which designated the United States of America and which claims priority to European patent application number EP15171872.3 filed Jun. 12, 2015, the entire contents of which are hereby incorporated herein by reference.

FIELD

An embodiment of present invention generally relates to a subsea converter.

BACKGROUND

In deep sea oil or gas production sites, subsea power grids are installed for providing the required power for electrical actuator like electric motors and electric pumps. For controlling an electric motor, voltage, current and AC frequency may be varied. To this end, a variable speed drive (VSD) may be provided in the power grid. These variable speed drives contain inter alia DC link capacitors. The current design depths of the subsea variable speed drive are 1-3000 meters, which gives a surrounding sea water pressure of approximately 1-300 bar. Applications at even higher water depths up to 5000 m are foreseeable.

Furthermore, subsea power electronic converters are used in this context, wherein the converters may be used for electromagnetic mapping of the sea bed. The converters may be filled with dielectric fluid and are pressure compensated such that the internal fluid pressure inside the converter enclosure is almost equal to the pressure outside, i.e. the pressure of the surrounding sea water.

The converter comprises various electronic components such as a transformer, a diode rectifier, DC link capacitor, IGBT (insulated gate bipolar transistor), inverter, control systems. It has been found that the capacitor of such a converter is especially sensitive to the conditions of the surrounding dielectric fluid. A long lifetime of the capacitor in a subsea environment is crucial for the functioning of the converter.

SUMMARY

Accordingly, the inventors have recognized that there is a need exist to further increase the lifetime of capacitors in a subsea environment.

Further aspects are described in the claims.

At least one embodiment of the invention relates to a subsea converter comprising an outer housing configured to be in contact with the subsea water when the converter is installed subsea. The converter furthermore comprises an inner housing provided inside the outer housing, wherein the inner housing is fluid tight sealed against the outer housing. A first electric component is located inside the outer housing but outside the inner housing, wherein the outer housing is filled with a first dielectric fluid. The subsea converter furthermore comprises at least one capacitor located inside the inner housing, wherein the inner housing is filled with a second dielectric fluid, wherein the second dielectric fluid has a lower moisture content than the first dielectric fluid.

These and other objects, features and advantages of the invention will become apparent when considered with the accompanying drawings, wherein like reference numerals indicate like structures throughout the Figures.

DETAILED DESCRIPTION OF EXAMPLE EMBODIMENTS

Figure 1:
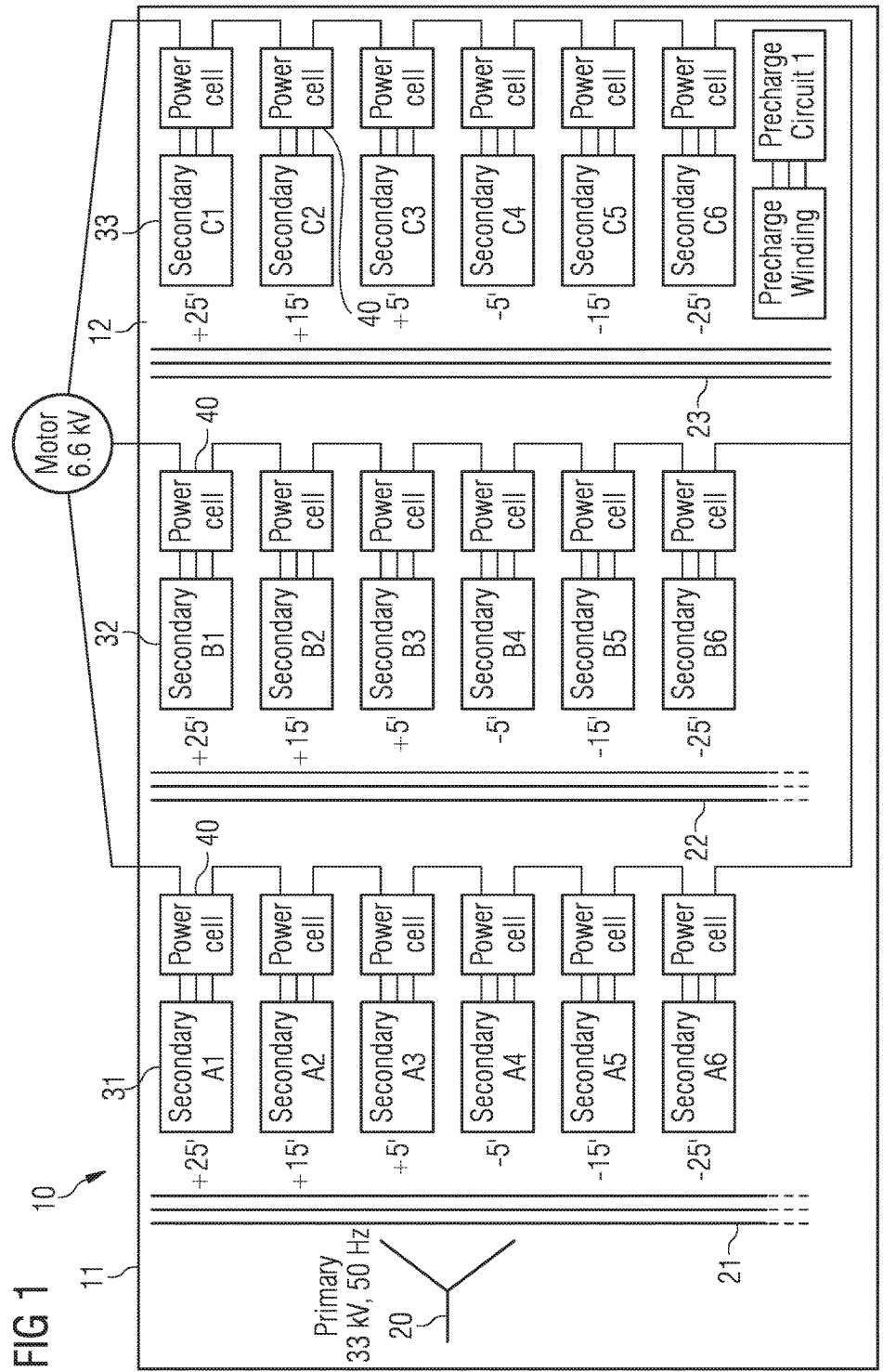
FIG. 1 is a schematic view of a subsea converter including a separate housing for the capacitors.

At least one embodiment of the invention relates to a subsea converter comprising an outer housing configured to be in contact with the subsea water when the converter is installed subsea. The converter furthermore comprises an inner housing provided inside the outer housing, wherein the inner housing is fluid tight sealed against the outer housing. A first electric component is located inside the outer housing but outside the inner housing, wherein the outer housing is filled with a first dielectric fluid. The subsea converter furthermore comprises at least one capacitor located inside the inner housing, wherein the inner housing is filled with a second dielectric fluid, wherein the second dielectric fluid has a lower moisture content than the first dielectric fluid.

It has been found that it is important to keep the moisture content in the fluid near the capacitor low. As it would be difficult and costly to maintain such a low humidity content in the entire subsea enclosure, the outer housing, the second housing is used to provide an environment which is favorable for the capacitor(s). If the moisture content has to be kept low in the outer housing, it would be necessary to use elements such as metal bellow volume compensators, metal seals and other expensive equipment.

Another disadvantageous alternative would be to impose a regime for drying and conditioning of the dielectric fluid frequently, e.g. every time the converter is brought back to the surface. This process would, however, require expensive drying equipment.

By providing two different housings, an inner and an outer housing, wherein the inner housing is fluid tight sealed against the outer housing and the inner housing is filled with a dielectric fluid having a lower moister content, it is possible to have a higher moisture or humidity content in the outer housing without degrading the capacitor in the inner housing. This solution allows for different humidity requirements inside the outer housing. By way of example, the moisture content in the second dielectric fluid in the inner housing may be lower than 50 or 30 ppm, while the moisture content outside the inner housing but inside the outer housing may be around or lower than 100 ppm.

The inner housing may comprise at least one fluid tight connecting element through which a first electrical terminal and a second electrical terminal is guided from the outer housing to the inner housing, with the first and second terminal being electrically connected to the at least one capacitor. As the at least one capacitor has to be electrically connected to the other components of the converter, the fluid tight connecting element can help to provide this connection, but to maintain the fluid separation between the inner and the outer housing.

The fluid tight connecting element can comprise two bus bar elements as first and second electrical terminals, wherein an inner insulating element can be sandwiched between the two bus bar elements. The capacitor can be connected to electronic components, such as transistors, IGBTs. With the bus bar elements and inner insulating element between the two bus bar elements, low inductance is obtained. The low inductance helps to avoid high voltage or overvoltages on the following electronic components such as transistors.

The low inductance connection can be achieved when the fluid tight connecting element comprises a sandwich structure in which the two bus bar elements are sandwiched between two outer insulating elements, with the inner insulating element being sandwiched between the two bus bar elements. In this sandwich structure, a layered structure is obtained with an outer insulator, one bus bar, the inner insulator, the other bus bar, and the second outer insulator. This provides a low inductance bus bar between the at least one capacitor and the electronic component to which the at least one capacitor is connected, such as IGBTs to minimize switching overvoltages.

The inner housing can comprise two fluid tight connecting elements, wherein the first and second electrical terminals enter the inner housing trough one of the two fluid tight connecting elements and exit the inner housing trough the other of the two fluid tight connecting elements.

The converter can furthermore be designed in such a way that the inner housing comprises a filling port though which the inner housing is filled with the second dielectric fluid. By way of example, the second dielectric fluid may be the fluid known under the trade name Midel 7131. Furthermore, the inner housing can comprise a volume compensating element configured to compensate for a volume change of the second dielectric fluid.

The inner housing can furthermore comprise a capacitor support structure which contains a support structure configured to support the at least one capacitor. The support structure can furthermore comprise at least one pair of plate shaped leaf springs configured to generate a pressure on the at least one capacitor. The support structure provides a bearing surface for the at least one pair of leaf springs and keeps the at least one pair of leaf springs in a compressed state in order to generate the pressure on the at least one capacitor.

The capacitor, e.g. a metalized film capacitor is exposed to the ambient pressure at the sea bed so that it should be designed to withstand the mechanical stress that is caused by this pressure. In a capacitor it is known that the interlayer pressure, i.e. a pressure distribution over the entire surface of the capacitor, between each layer and the capacitor is necessary for the capacitor such as a metalized film capacitor to function correctly when the ambient pressure increases. In atmospheric pressure it is relatively easy to obtain the sufficient inter layer pressure, since the shape of the capacitor is constant. However, due to the volume compressibility of components of the capacitor, the capacitor will be compressed and deformed as the ambient pressure at subsea application increases. With the support structure and the at least one pair of plate shaped leaf springs, it is possible to generate a pressure on the at least one capacitor such that the interlayer pressure is above a critical interlayer pressure so that a negative impact due to a low interlayer pressure is avoided.

The two leaf springs may be arranged relative to each other in such a way that the plate shaped springs only contact each other at edge sections of the leaf springs and that a closed space is generated between the leaf springs that is closed in opposite directions by the two leaf springs. With such an arrangement, a height change due to the increasing ambient pressure can be compensated for as the two leaf springs can compensate for the smaller height of the at least one capacitor. Thus, even at high ambient pressures, the interlayer pressure is maintained high.

Each inner housing can comprise a plurality of capacitors, each capacitor comprising two connecting elements, each of which is connected to one of the first and second electrical terminal.

The first electric component located inside the outer housing, but outside the inner housing can contain a transformer and/or any other component such as a rectifier, an inverter.

The converter may comprise a plurality of capacitor banks, where each capacitor bank containing a plurality of capacitors is located in an inner housings so that the outer housing accommodates a plurality of inner housings, each inner housing accommodating a plurality of capacitors.

Features mentioned above and features still to be explained may not only be used in isolation or in combination as explicitly indicated but also in other combinations. Features in the embodiments of the present invention may be combined unless explicitly mentioned otherwise.

In the following, embodiments of the invention will be described in detail with reference to the accompanying drawings. The drawings are to be regarded as being schematic representations, and elements illustrated in the drawings are not necessarily shown to scale. Rather the various elements are represented such that their function and general purpose becomes apparent for a person skilled in the art. The connection or coupling between functional blocks or devices or components shown in the drawings or described herein may be implemented by a direct or indirect connection or coupling. A coupling between components may be established over a wired or a wireless connection.

FIG. 1 shows a subsea converter 10 which may be part of a subsea power grid providing electrical power for electrical actuators or which may be used for electromagnetic mapping of the sea bed. The converter can also be part of a variable speed drive. The converter 10 comprises a transformer 20, which in the embodiment shown is a three-phase transformer with three primary windings 21, 22 and 23. The signal present at the primary winding may be the input signal with 50 Hz alternating current and may be a high voltage input signal with a voltage level such as 30 kV or higher. Each of the primary windings 21, 22, 23 is connected to a corresponding secondary winding 31, 32 and 33. The first phase of the secondary winding 31 may have a plurality of secondary windings, in the embodiment shown six different secondary windings 31. Each of the windings is connected to a power cell 40, which may be more or less identical. The power cell 40 can be part of a converter as will be explained in further detail below. The converter 10 is filled with a first dielectric fluid. The converter 10 comprises an outer housing 11, which separates the converter 10 from the surrounding subsea water. Inside the housing 11, a dielectric fluid 12 is provided. The dielectric fluid 12 inside the housing 11 is approximately at the same pressure as the surrounding sea water. The dielectric fluid such as Midel 7131 or any other oil, such as rapeseed oil can have a humidity of 100 ppm.

Figure 2:
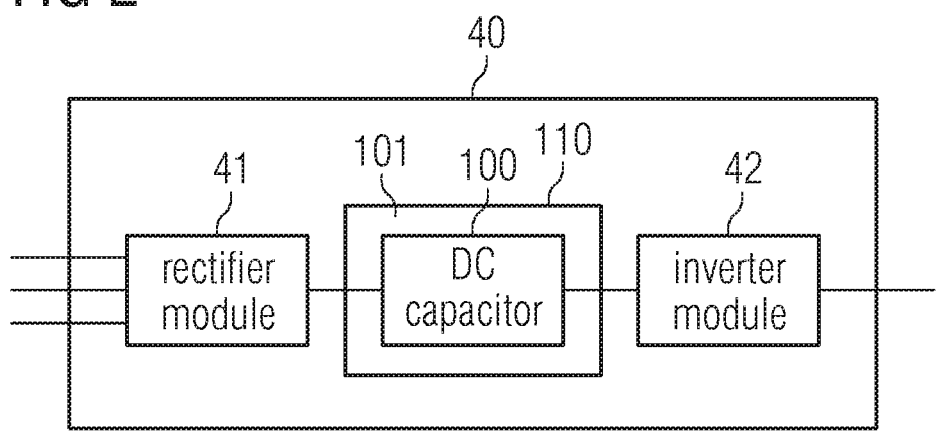
FIG. 2 is a schematic more detailed view of a part of the converter shown in FIG. 1 including the inner housing for the capacitor.

The power cell 40 is disclosed in further detail in FIG. 2, where a schematic view of such a power cells is shown. The power cell 40 receives the output from the secondary winding such as windings 31, 32 and 33 with the three phases of the signal. The power cell 40 can comprise a rectifier module 41 followed by a capacitor module 100. The output of the capacitor module 100 is fed to the inverter module 42. The rectifier module 41 and the inverter module 42 for the converter and the corresponding functioning are well known to the skilled person so that detailed description of these modules is omitted for the sake of clarity. The DC capacitor module comprising a plurality of capacitors or a capacitor bank is located in a housing 110, which is also called inner housing 110 hereinafter in order to differentiate this housing from the outer housing or enclosure 10, which is in contact with the subsea environment when installed subsea. The inner housing 110 is fluid tight sealed against the outer housing and is filled with a second dielectric fluid 101. The second dielectric fluid has a lower moisture content than the dielectric fluid 12 present in the outer housing 11. The moisture content of the fluid 101 is lower than the moisture content of the fluid 12, e.g. between 100 and 200 ppm in the outer housing and between 30 and 50 ppm insider the inner housing. In the embodiment of FIG. 2, the DC capacitor module 100 is shown to be contained in the inner housing 110. It should be understood that the rectangle shown in FIG. 2 does not indicate a further housing inside the inner housing 110, but simply delimits the functional module of the capacitor module.

Figure 3:
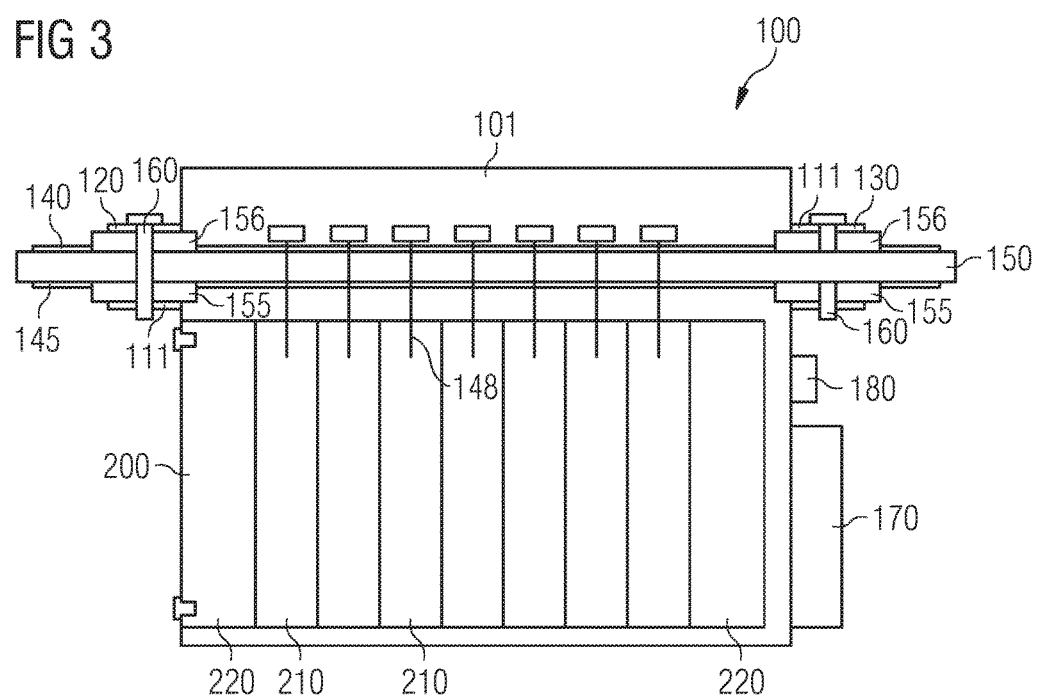
FIG. 3 is a schematic view of the inner housing shown in FIG. 2 including a capacitor stack.

This is further explained in connection with FIG. 3, where the DC capacitor module 100 is shown in more detail. As shown, the capacitor module is contained in an inner housing 110, which seals the inner housing against the environment outside the inner housing. The inner housing is filled with the second dielectric fluid 101, which has, as mentioned above, a lower moisture content than the dielectric fluid 12 in the outer housing. The dielectric fluid inside the outer and inner housings can be the same fluid, but with different moisture contents. However, fluid 101 inside the inner housing 110 can also differ from the fluid outside the inner housing 110. Inside the inner housing 110, a capacitor support structure 200 with a plurality of capacitors 210 is provided. The structure of the capacitor support structure will described further below in connection with FIGS. 4 to 6. The inner housing has two fluid tight connecting elements 120 and 130, through which the electrical components inside housing 110 are connected to the other components outside the inner housing 110. As can be seen, a first electrical terminal in the form of a bus bar 140 and a second electrical terminal in the form of a bus bar 145 enter the inner housing 110. The two bus bars 140, 145 are separated by a gasket 150 working as inner electrical insulator. Furthermore, two outer electrical insulators 155 and 156 are provided, which protect the bus bars from the outside at the part of the inner housing where the fluid tight seal at connecting elements 120 and 130 is provided. The insulator 150, 155 and 156 may be of the same material; however, they may also be made of a different material. Fixing elements 160 are provided at outer flanges 111, where the fluid tight seal is obtained.

Each of the capacitors 210 has two electrical terminals such as terminal 148. It should be noted that only one terminal per capacitor is shown as the other terminal of the same capacitor is located in the plane behind and is hidden by the terminal 148 shown. Each of the two terminals 148 is connected to one of the bus bars. Thus, a first terminal 148 of one capacitor is connected to one of the bus bars, e.g. bus bar 140, whereas the other terminal of the same capacitor is connected to the other bus bar, e.g. bus bar 145.

The housing furthermore comprises a volume compensating element 170 to compensate for volume changes of the components inside housing 110. Furthermore, filling port 180 or plug for filling the dielectric fluid into the housing 110 is provided. The filling port can be closed and in the closed status the fluid tight seal is also present at the filling port 180 between the inner housing 110 and the outer housing 10.

Figure 4:
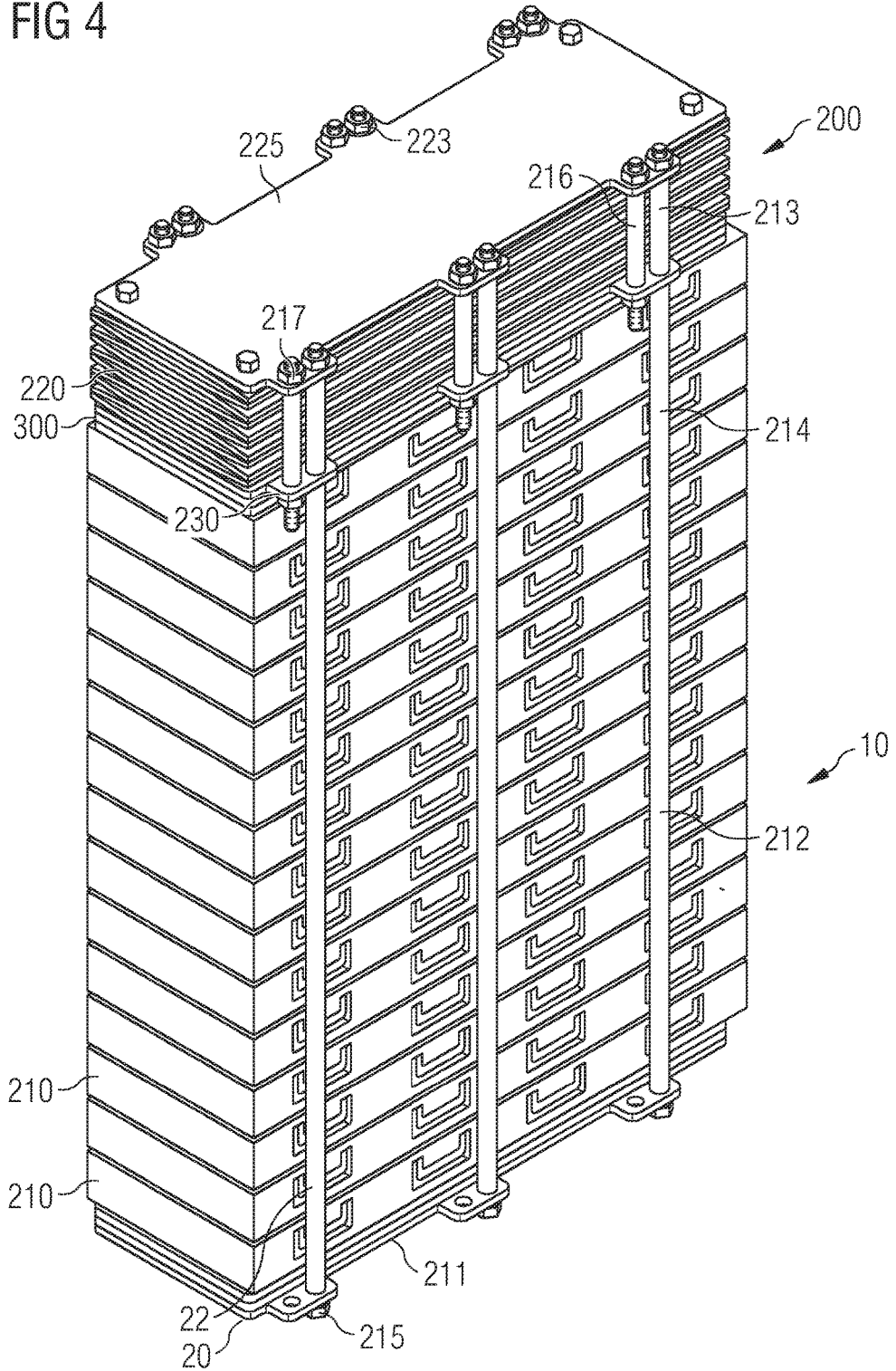
FIG. 4 shows a perspective view of a capacitor support structure used in FIG. 3.

The plurality of capacitors 210 are provided in a support structure 200, which comprises a pressure generating module 220 on the upper and lower or left and right side of the bank of capacitors 210. This support structure 200 is explained in more detail in connection with FIG. 4. In the embodiment of FIG. 4, for the sake of clarity only a single pressure generating module 220 is provided on one side of the stack of capacitors 210, whereas two pressure generating modules are used in the embodiment of FIG. 3. In the embodiment shown in FIG. 4, the stack of capacitors and the support structures is shown in a vertical orientation, whereas in the embodiment of FIG. 3, the capacitor stack is provided in a horizontal orientation. The support structure with bottom plate 211 and support bars 212 define the space where the capacitors 210 are arranged. In the embodiment of FIG. 4, the stack of capacitors comprises 15 capacitors on top of one another. However, it should be understood that any number of capacitors could be located in the support structure. The support structure comprises a threaded rod 213 which extends over the entire length of the support structure, the threaded rod 213 being provided inside an insulation 214 to insulate the threaded rod from the capacitors 210. The threaded rod 213 is connected to the bottom plate 211 using fixing elements 215. In the embodiment shown in FIG. 4, the system is indicated in a transport or manufacturing state not ready for use. Next to threaded rod 213, a shorter transport rod 216 is provided, which extends substantially over the length of pressure generating module 220, in which a plurality of leaf springs 300 are provided, which are discussed in further detail below in connection with FIGS. 5 and 6. The rod 216 is connected to bearing plate 225 and to a pressure transmission plate 230. When the capacitor support structure is prepared for use in subsea applications, the fixing elements 217 provided at the short rods are removed on the upper and lower part of the transport rod. In order to respond to the forces generated by the leaf springs 300 a transmission plate can change its height and will be pressed on the upper surface of the stack of capacitors. When the capacitor support structure is used subsea in a depth of up to 3000 m or more, the capacitor stack will be compressed and deformed as the ambient pressure increases. A typical height change for the capacitor stack having a height of about 400 mm can be around 10 mm. This height change will be absorbed by the pressure generating module including the leaf springs 300.

Figure 5:
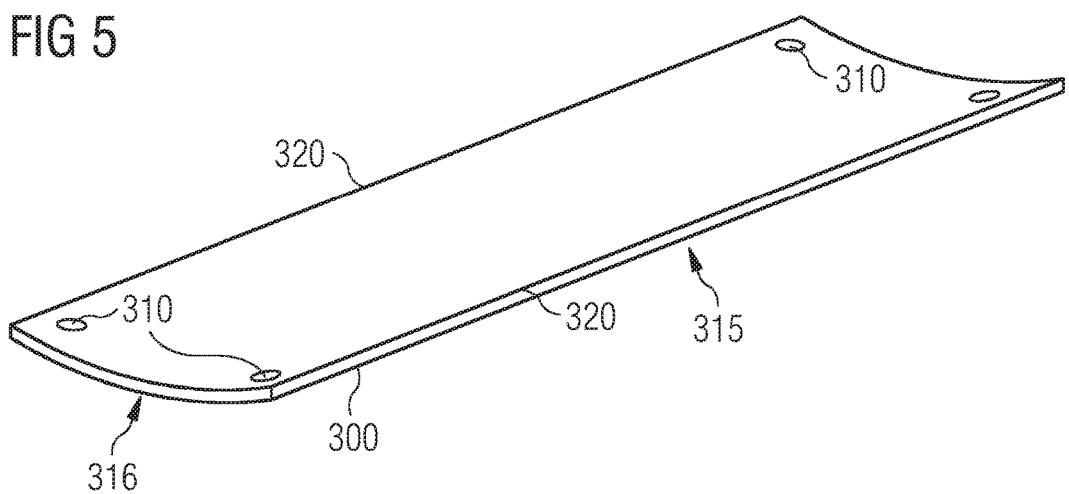
FIG. 5 shows a perspective view of one leaf spring used in the capacitor support structure shown in FIG. 4.
Figure 6:
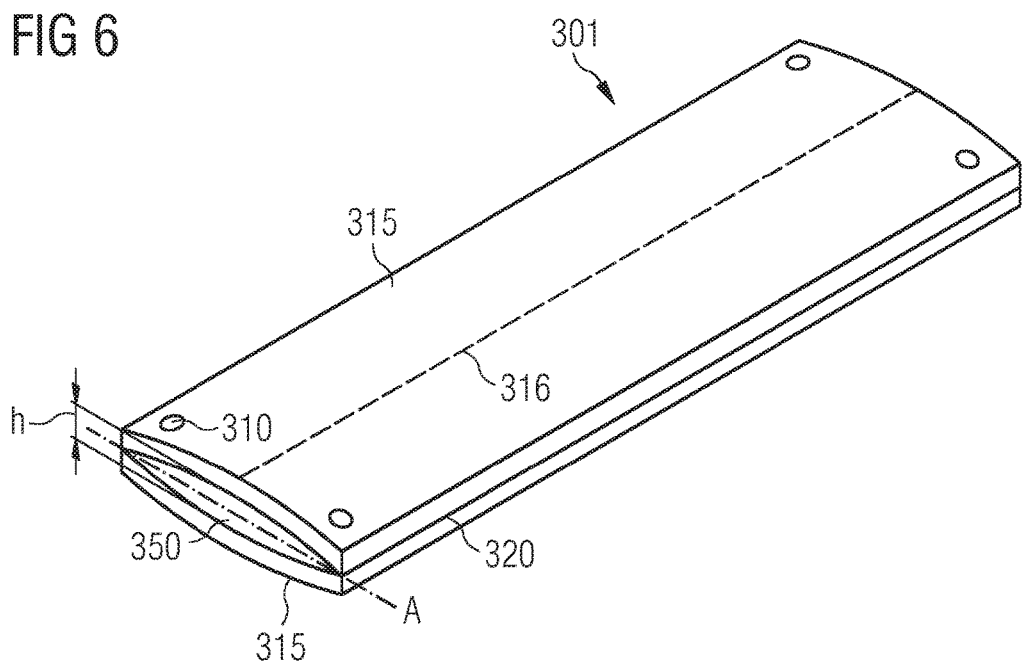
FIG. 6 shows an arrangement of two leaf springs in a pair of leaf springs relative to one another in the capacitor support structure shown in FIG. 4.

The capacitor support structure is disclosed in further detail in the European patent application EP 14 180 238.9 from the same applicant. For further details of the capacitor support structure, reference is made to this application. As shown in FIGS. 5 and 6, the leaf spring 300 is an arch shaped plate which covers a ground surface which substantially corresponds to the surface covered by one capacitor. FIG. 6 shows a pair of leaf springs, wherein several of these pairs can be arranged as shown in FIG. 4 in the pressure generating module 220. In each pair of leaf springs, two leaf springs are arranged relative to one another such that the leaf springs are not arranged parallel to one another, meaning that the curvature has the same orientation, but antiparallel, meaning that the arch shaped plates contact each other at the outer ends or outer edge sections 320 of leaf spring 300. As can be especially deduced from FIG. 6, where one pair of leaf springs 301 is shown, the arch shaped plates only contact one another at the outer edge section 320, and a closed space 350 is generated between two leaf springs having the maximum height h at the apex 316 of the plates. The pair of leaf springs provide convex shaped outer surfaces 315 with the apex 316 as shown by the dotted line of FIG. 6. A possible deformation provided by each pair of springs is the height h. Furthermore, two neighboring pairs of leaf springs may be arranged such that they contact one another in their corresponding apex. With this arrangement of the leaf spring pairs, when n pairs of leaf springs are used, the maximum possible deflection of the springs is n×h. The transmission plate 230 shown in FIG. 4 transmits the force generated by the springs has a pressure to the stack of capacitors. As the apex contacts more or less the center line of the transmission plate 230, it can be assured that high pressure is transmitted to the central section of the capacitor and not to the boarder section.

For further details of the leaf springs and the possible arrangement of pressure compensating modules on one or both sides of the capacitor stack, reference is made to the above-mentioned European patent application EP 14 180 238.9.

Summarizing, the above-discussed invention allows a separate fluid volume inside the inner housing, where the capacitors are provided. The fluid inside the inner housing can have different conditions than the fluid outside the inner housing, i.e. a lower humidity content. Furthermore, the fluid tight connecting element used in the inner housing is designed such that a low inductance configuration of the electrical contacts is obtained. The use of a separate inner housing for the stack of capacitors further simplifies the storage, handling and installation of capacitors. Especially during installation in the factory, the capacitor bank can be exposed to air and humidity only very briefly as the inner housing may already be filled with the second dielectric fluid having the low moisture content. Thus, the capacitors may be stored onsite in case of a failure. Furthermore, the inner housing simplifies and improves the ability to replace capacitor bank as complete inner housing may be replaced by another inner housing.

The invention claimed is:

1. A subsea converter, comprising:
   an outer housing, configured to be in contact with the subsea water upon the converter being installed subsea;
   an inner housing provided inside the outer housing, the inner housing being fluid tight sealed against the outer housing;
   at least one first electric component, located inside the outer housing and outside the inner housing, the outer housing being filled with a first dielectric fluid; and
   at least one capacitor, located inside the inner housing, the inner housing being filled with a second dielectric fluid, the second dielectric fluid having a relatively lower moisture content than the first dielectric fluid,
   wherein the inner housing includes a capacitor support structure, the capacitor support structure including:
      a support structure configured to support the at least one capacitor, and
      at least one pair of plate shaped leaf springs configured to generate a pressure on the at least one capacitor, the support structure providing a bearing surface for the at least one pair of plate shaped leaf springs and keeping the at least one pair of leaf springs in a compressed state to generate the pressure on the at least one capacitor, and
   wherein two plate shaped leaf springs of the at least one pair of plate shaped leaf springs are arranged relative to each other such that the two plate shaped springs only contact each other at edge sections of the two plate shaped leaf springs and such that a closed space is generated between the two plate shaped leaf springs that is closed in opposite directions by the two plate shaped leaf springs.

2. The subsea converter of claim 1, wherein the inner housing further includes at least one fluid tight connecting element through which a first electrical terminal and a second electrical terminal is guided from the outer housing to the inner housing, the first and second terminal being electrically connected to the at least one capacitor, wherein the fluid tight connecting element includes two bus bar elements as first and second electrical terminals, and wherein an inner insulating element is sandwiched between the two bus bar elements.

3. The subsea converter of claim 2, wherein the fluid tight connecting element includes a sandwich structure in which the two bus bar elements are sandwiched between two outer insulating elements, the inner insulating element being sandwiched between the two bus bar elements.

4. The subsea converter of claim 2, wherein the inner housing comprises two fluid tight connecting elements, wherein the first and second electrical terminals enter the inner housing through one of the two fluid tight connecting elements and exit the inner housing through the other of the two fluid tight connecting elements.

5. The subsea converter of claim 1, wherein the inner housing comprises a filling port through which the inner housing is filled with the second dielectric fluid.

6. The subsea converter of claim 1, wherein the inner housing comprises a volume compensating element configured to compensate for a volume change of the second dielectric fluid.

7. The subsea converter of claim 1, wherein the subsea converter includes a plurality of capacitors located in the inner housing, the plurality of capacitors including the at least one capacitor, each of the plurality of capacitors comprising two connecting elements, each of the two connecting elements respectively being connected to a respective one of the first and second electrical terminal.

8. The subsea converter of claim 1, wherein a moisture content of the second fluid is lower than 50 ppm.

9. The subsea converter of claim 1, wherein the at least one first electric component is located inside the outer housing, outside the inner housing including a transformer.

10. The subsea converter of claim 1, wherein the subsea converter includes a plurality of inner housings, the plurality of inner housings including the inner housing, each of the plurality of inner housings being fluid tight sealed against the outer housing, and wherein the at least one capacitor is located in each of the plurality of inner housings.

11. The subsea converter of claim 1, wherein the inner housing and the outer housing are pressure compensated such that a pressure inside the inner housing and inside the outer housing correspond to a surrounding water subsea.

12. The subsea converter of claim 3, wherein the inner housing comprises two fluid tight connecting elements, wherein the first and second electrical terminals enter the inner housing through one of the two fluid tight connecting elements and exit the inner housing through the other of the two fluid tight connecting elements.

13. The subsea converter of claim 2, wherein the inner housing comprises a filling port through which the inner housing is filled with the second dielectric fluid.

14. The subsea converter of claim 2, wherein the inner housing comprises a volume compensating element configured to compensate for a volume change of the second dielectric fluid.

15. The subsea converter of claim 2, wherein the subsea converter includes a plurality of capacitors located in the inner housing, the plurality of capacitors including the at least one capacitor, each of the plurality of capacitors comprising two connecting elements, each of the two connecting elements respectively being connected to a respective one of the first and second electrical terminal.

16. The subsea converter of claim 8, wherein a moisture content of the second fluid is lower than 30 ppm.

* * * * *